(12) United States Patent
Grant

(10) Patent No.: US 8,454,728 B2
(45) Date of Patent: Jun. 4, 2013

(54) METHOD OF RECYCLING HYDROGEN

(75) Inventor: Robert Bruce Grant, Steyning (GB)

(73) Assignee: Edwards Limited, Crawley, West Sussex (GB)

( * ) Notice: Subject to any disclaimer, the term of this patent is extended or adjusted under 35 U.S.C. 154(b) by 701 days.

(21) Appl. No.: 12/440,985

(22) PCT Filed: Aug. 3, 2007

(86) PCT No.: PCT/GB2007/050470
§ 371 (c)(1),
(2), (4) Date: Nov. 3, 2009

(87) PCT Pub. No.: WO2008/032108
PCT Pub. Date: Mar. 20, 2008

(65) Prior Publication Data
US 2010/0071549 A1  Mar. 25, 2010

(30) Foreign Application Priority Data
Sep. 13, 2006 (GB) .................................. 0618016.0

(51) Int. Cl.
*B01D 53/30* (2006.01)
*B01D 53/22* (2006.01)
*B01D 53/00* (2006.01)

(52) U.S. Cl.
USPC ............... 95/55; 95/8; 95/12; 95/45; 95/131; 95/142; 96/4; 96/9; 96/121; 96/417; 118/715

(58) Field of Classification Search
USPC ............... 95/8, 12, 39, 45, 48, 55, 130, 131, 95/142, 20, 22; 96/4, 9, 108, 121, 417; 118/715, 118/723 R; 134/1.1, 1.2, 1.3; 62/600, 617, 62/657
See application file for complete search history.

(56) References Cited

U.S. PATENT DOCUMENTS 4,941,893 A * 7/1990 Hsieh et al. ................. 95/55
5,779,763 A * 7/1998 Pinnau et al. ............... 95/45
(Continued)

FOREIGN PATENT DOCUMENTS

JP         8245292 A    9/1996
JP    2002-121673 A    4/2002
(Continued)

OTHER PUBLICATIONS

Tonoi Kazuto, Hiraki Akio, Hatta Akimitsu; English language abstract of Japanese Publication No. JP8245292 A, entitled "Production of Diamond Film," Gunze KK; Hiraki Akio; Hatta Akimitsu; Sep. 24, 1996.

(Continued)

Primary Examiner — Jason M Greene

(57) ABSTRACT

A method is described for recycling hydrogen (H2) supplied to a chamber (10) in a gas stream comprising hydrogen and at least one other gas, such as silane. A gas comprising at least hydrogen is drawn from the chamber (10) using a first vacuum pump (32) that exhausts gas therefrom at a sub-atmospheric pressure. A portion of the gas exhausted from the first vacuum pump (32), for example between 70 and 95% of this gas, is diverted away from a second vacuum pump (34) backing the first vacuum pump (32). In one embodiment, the diverted portion of the sub-atmospheric pressure gas is treated to produce a purified gas comprising hydrogen, which is stored in a storage vessel (14). The composition of the purified gas is analysed, and, depending on the results of the analysis, at least one of hydrogen and silane is added to the stored gas so that the composition of the stored gas is similar to that of the gas initially supplied to the chamber (10). Gas is then supplied to the chamber (10) from the storage vessel (14).

27 Claims, 3 Drawing Sheets

U.S. PATENT DOCUMENTS

| | | | |
|---|---|---|---|
| 5,958,138 A * | 9/1999 | Tomita et al. | 118/715 |
| 6,254,666 B1 * | 7/2001 | Li et al. | 95/45 |
| 6,444,011 B2 * | 9/2002 | Li et al. | 95/45 |
| 6,491,758 B1 * | 12/2002 | Hasegawa et al. | 118/715 |
| 6,863,019 B2 * | 3/2005 | Shamouilian et al. | 118/723 R |
| 2002/0034880 A1 | 3/2002 | Sakai et al. | |
| 2002/0146506 A1 | 10/2002 | Yoo | |
| 2003/0036272 A1 | 2/2003 | Shamouilian et al. | |
| 2004/0134890 A1 | 7/2004 | Uhm et al. | |
| 2006/0099123 A1 * | 5/2006 | Seeley et al. | 423/237 |

FOREIGN PATENT DOCUMENTS

| | | |
|---|---|---|
| WO | 2004/018080 A1 | 3/2004 |
| WO | 2004/018353 A1 | 3/2004 |

OTHER PUBLICATIONS

Agawa Yoshiaki, Fukazawa Hiroyuki, Furuse Harukuni; English language abstract of Japanese Publication No. JP2002121673 A, entitled "Thermal CVD System for Depositing Graphite Nanofiber Thin Film," ULVAC Corp; Apr. 26, 2002.

United Kingdom Search Report of Application No. GB0618016.0 mailed Jan. 15, 2007; Claims searched: 1-29; Date of search: Jan. 12, 2007.

PCT Notification of Transmittal of the International Search Report and the Written Opinion of the International Searching Authority, or the Declaration of International Application No. PCT/GB2007/050470; Date of mailing: Nov. 26, 2007.

PCT International Search Report of International Application No. PCT/GB2007/050470; Date of mailing of the International Search Report: Nov. 26, 2007.

PCT Written Opinion of the International Searching Authority of International Application No. PCT/GB2007/050470; Date of mailing: Nov. 26, 2007.

* cited by examiner

METHOD OF RECYCLING HYDROGEN

FIELD OF THE INVENTION

The present invention relates to a method of, and apparatus for, recycling hydrogen ($H_2$) supplied to a chamber.

BACKGROUND OF THE INVENTION

Chemical vapour deposition (CVD) is used to deposit thin films or layers on the surface of a substrate or wafer located in a deposition chamber. This process operates by supplying one or more reactive gases, often using a carrier gas, to the substrate's surface under conditions that encourage chemical reactions to take place at the surface. For example, TEOS and one of oxygen and ozone may be supplied to the deposition chamber for the formation of a silicon oxide layer on the substrate, and silane and ammonia may be supplied for the formation of a silicon nitride layer.

The production of silicon thin film solar cells requires the sequential deposition of p-type, i-type and n-type layers of silicon on a glass substrate having a transparent conductive layer formed thereon. Each silicon deposition is conducted in a respective chamber in which a plasma-enhanced CVD method is performed by the application of a high frequency power to an electrode located within the chamber. For example, the glass substrate is initially located in a first evacuated chamber into which a gas mixture containing silane ($SiH_4$), a dopant such as $B_2H_6$ and hydrogen ($H_2$) as a carrier gas is supplied to form a p-type silicon layer on the substrate. The substrate is then moved to a second evacuated chamber, into which a gas mixture of $H_2$ and $SiH_4$ is supplied to form an i-type silicon layer on the substrate. The substrate is then moved to a third evacuated chamber, into which a gas mixture of $H_2$, $SiH_4$ and a dopant such as $PH_3$ is supplied to form an n-type silicon layer on the substrate. Depending on the nature of the solar cell, the substrate may be moved between further chambers for the deposition of further silicon layers on the substrate. Upon completion of the silicon deposition, the substrate is moved to a final chamber in which a second transparent conductive layer and an electrode are formed on the substrate, for example using a sputtering technique, to complete manufacture of the solar cell.

There is a trend in the manufacture of devices such as solar cells to perform deposition on increasingly larger substrates to deliver economies of scale, with the substrate being diced upon completion of the deposition steps to produce a multiplicity of individual devices of the required size. As a result, the size of the deposition chambers and the flow rates of the gases supplied thereto, in particular that of carrier gases such as $H_2$, must also increase to accommodate the larger substrates and produce acceptable deposition rates. For example, currently the flow rate of $H_2$ into a chamber of a solar cell manufacturing tool is around several hundred slm, but it is envisaged that future generation tools will require a $H_2$ flow rate of at least 1000 slm into each chamber.

As the flow rate of gas entering a deposition chamber increases the size of the vacuum pumping system used to evacuate the chamber and draw the unconsumed process gases and any reaction by-products from the chamber must also increase. Furthermore, the gas stream drawn from the chamber requires treatment before it is exhausted into the atmosphere to remove any potentially hazardous gases such as $H_2$. For this reason, the gas stream is usually conveyed to an abatement device in which the hydrogen is burnt in a controlled manner. The size and energy consumption of a pumping and abatement system used to pump a gas stream containing 1000 slm of $H_2$ to atmospheric pressure and then treat a gas stream, together with the associated capital cost of such a system and the cooling water consumption of the abatement device, will be significant. There are also safety issues associated with large flows of hydrogen at atmospheric pressure. Whilst $H_2$ is a relatively inexpensive gas, there will be costs associated with the transportation of large amounts of hydrogen to the process tool.

Consequently, a more cost-effective technique for handling a gas stream containing a relatively large amount of $H_2$ is required.

SUMMARY OF THE INVENTION

In a first aspect, the present invention provides a method of recycling hydrogen supplied to a chamber, the method comprising the steps of drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, and supplying the purified gas to the chamber.

In a second aspect the present invention provides a method of recycling hydrogen ($H_2$) supplied to a chamber in a gas stream comprising hydrogen and at least one other gas, the method comprising the steps of drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, storing the purified gas in a storage vessel, analysing the composition of the purified gas, depending on the composition of the purified gas adding at least one of hydrogen and said at least one other gas to the gas stored in the storage vessel, and supplying gas from the storage vessel to the chamber.

In a third aspect the present invention provides a method of performing deposition of silicon on a substrate located in a chamber, the method comprising the steps of supplying a gas comprising hydrogen and a silicon hydride to the chamber from a storage vessel, drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, storing the purified gas in the storage vessel, analysing the composition of the purified gas, depending on the composition of the purified gas, adding at least one of hydrogen and said silicon hydride to the gas stored in the storage vessel.

In a fourth aspect, the present invention provides apparatus for recycling hydrogen ($H_2$) supplied to a chamber, the apparatus comprising a first vacuum pump for drawing gas comprising at least hydrogen from the chamber and exhausting gas at a sub-atmospheric pressure therefrom, a second vacuum pump for receiving sub-atmospheric pressure gas from the first vacuum pump, means for diverting away from the second vacuum pump a portion of the sub-atmospheric pressure gas exhausted from the first vacuum pump, means for treating the diverted portion of the sub-atmospheric pressure gas to produce a purified gas comprising hydrogen, and gas supply means for supplying the purified gas to the chamber.

In a fifth aspect, the present invention provides apparatus for recycling hydrogen ($H_2$) supplied to a chamber in a gas stream comprising hydrogen and at least one other gas, the apparatus comprising a first vacuum pump for drawing gas comprising at least hydrogen from the chamber and exhausting gas at a sub-atmospheric pressure therefrom, a second vacuum pump for receiving sub-atmospheric pressure gas from the first vacuum pump, means for diverting away from the second vacuum pump a portion of the sub-atmospheric pressure gas exhausted from the first vacuum pump, means for treating the diverted portion of the sub-atmospheric pressure gas to produce a purified gas comprising hydrogen, a storage vessel for storing the purified gas in a storage vessel, a gas analyser for analysing the composition of the purified gas, means for adding at least one of hydrogen and said at least one other gas to the gas stored in the storage vessel depending on the composition of the purified gas, and means for supplying gas from the storage vessel to the chamber.

BRIEF DESCRIPTION OF THE DRAWINGS

Preferred features of the present invention will now be described, by way of example, with reference to the accompanying drawings, in which.

DETAILED DESCRIPTION OF THE INVENTION

Figure 1:
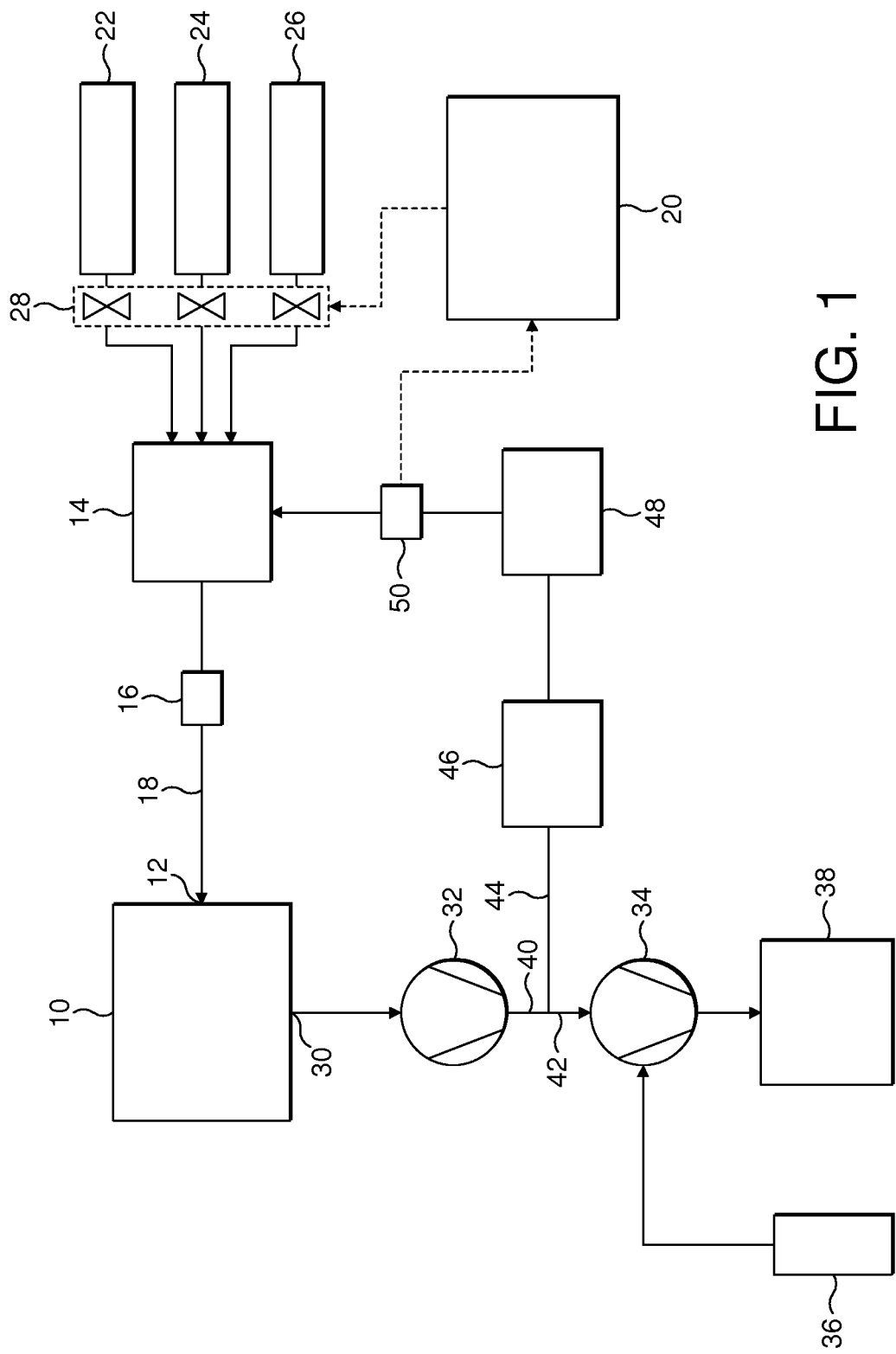
FIG. 1 illustrates schematically one example of an apparatus for recycling hydrogen supplied to a chamber.

With reference first to FIG. 1, a chamber 10 is provided with an inlet 12 for receiving gas from a storage vessel 14. A control valve or mass flow controller 16 may be provided in a conduit 18 through which gas is supplied to the inlet 12 from the storage vessel 14. The mass flow controller 16 is controlled by a system controller 20 to ensure that the required amount of gas is supplied to the chamber 10.

In this example, the chamber 10 is a deposition chamber within which chemical vapour deposition of a layer of silicon is performed on a substrate located within the chamber 10. The gas supplied to the chamber 10 comprises a silicon hydride, for example silane, with a hydrogen ($H_2$) carrier gas, and optionally a dopant such as $B_2H_6$ or $PH_3$. Consequently, a source 22 of hydrogen and a source 24 of silane are provided for supplying these gases to the storage vessel 14. A source 26 of dopant may be optionally provided for supplying dopant to the storage vessel 14. The flow of these gases into the storage vessel 14 is controlled by the system controller 20. The system controller 20 issues commands to a valve arrangement 28 located between the storage vessel 14 and these sources 22, 24, 26 to control the respective flow rates of these gases into the storage vessel 14 and thereby control the composition of the gas stored within the storage vessel 14.

The chamber 10 is evacuated by a vacuum pumping arrangement. The pumping system comprises a first vacuum pump 32 which draws gas from the chamber 10 through outlet 30. The first vacuum pump 32 is preferably in the form of a mechanical booster vacuum pump having magnetic bearings. The first vacuum pump is configured to generate a vacuum of at least 1 to 5 mbar in the chamber 10.

Gas is exhausted from the first vacuum pump 32 at a sub-atmospheric pressure, for example in the range from 5 to 100 mbar. In view of this, the pumping system also comprises a second vacuum pump 34 for backing the first vacuum pump 32, and which receives sub-atmospheric pressure gas from the first vacuum pump 32 and raises its pressure to around atmospheric pressure. The second vacuum pump 34 also receives purge gas, for example nitrogen, from a purge gas source 36 to prevent damage to the pumping mechanism of the second vacuum pump 34 and to maintain the hydrogen partial pressure below the lower explosion limit.

The gas drawn from the chamber 10 will contain predominantly hydrogen carrier gas, together with unconsumed silane and dopant, and by-products from the deposition process. Consequently, the gas exhausted from the second vacuum pump 34 is conveyed through an abatement device 38. The abatement device 38 may take any desired form, such as an incineration, plasma abatement or thermal decomposition unit, for removing desired components such as hydrogen and silicon hydrides from the gas before it is exhausted to the atmosphere. As an alternative to locating the abatement device 38 downstream from the second vacuum pump 34, it may be more desirable to locate the abatement device 38 between the vacuum pumps 32, 34; depending on the nature of the abatement device 38, it may be more efficient to operate the abatement device 38 at a sub-atmospheric pressure rather than at the elevated pressure of the gas exhausted from the second vacuum pump 34.

Depending on the size of the chamber 10, the flow rate of gas from the storage vessel 14 into the chamber 10 may be high, for example at least several hundred slm (standard litres per minute). In order to reduce the sizes of the second vacuum pump 34 and the abatement device 38, and the amount of fresh gas supplied to the chamber 10, a portion of the sub-atmospheric pressure gas exhausted from the first vacuum pump 32 is conveyed back to the storage vessel 14 to recycle a portion of at least the hydrogen supplied to the chamber.

Returning to FIG. 1, a foreline conduit 40 extends between the first vacuum pump 32 and the second vacuum pump 34 for conveying the gas exhausted from the first vacuum pump 32 to the second vacuum pump 34. The foreline 40 comprises a branch portion 42 for receiving the sub-atmospheric pressure gas from the first vacuum pump 32 and splitting the gas into first and second portions. The first portion of the gas stream is conveyed towards the second vacuum pump 34 along the remainder of the foreline 40, whilst the second portion is diverted away from the second vacuum pump 34 and is conducted by gas conduit 44 back to the storage vessel 14 at a sub-atmospheric pressure, preferably in the range from 5 to 100 mbar.

A multi-way valve (not illustrated) may be located at the branch 42 to determine the flow rates of the first and second portions. Alternatively, a variable flow valve (not illustrated) may be located within the gas conduit 44 downstream from the branch 42 to control the flow rate of gas through the gas conduit. A pressure control valve may also be located within the foreline 40 between the branch portion 42 and the first vacuum pump 32. Preferably, at least 70%, more preferably between 70 and 95%, of the sub-atmospheric pressure gas exhausted by the first vacuum pump 32 is diverted into the gas conduit 44, with the remainder being conveyed through the second vacuum pump 34 and the abatement device 38.

The gas conduit 44 includes a number of devices for treating the diverted portion of the gas to produce a purified gas comprising hydrogen. For example, a first gas treatment device 46 may be provided for removing any unconsumed dopant from the diverted portion of the gas. Such a device 46 may comprise a solid-state purifier comprising an alkali metal ion conducting membrane. Alkali metal ion conducting membranes such as a sodium or potassium beta alumina are able to transport alkali metal ions to an active surface of the membrane through the application of a current between electrodes formed on the surfaces of the membrane. Once an amount of alkali metal has been transported to the active surface of the membrane, the purifier can behave as an electrochemical concentration cell, with the alkali metal ions reacting with species contained in the diverted portion of the gas to form material which is either retained on the active surface of the membrane, deposited on the inner surfaces of the gas conduit 44, or removed from the diverted portion of the gas by a particle trap, electrostatic precipitator and/or filter (not illustrated) located between the first gas treatment device 46 and the storage vessel 14.

A second gas treatment device 48 may be provided for treating any silicon hydrides within the diverted portion of the gas, for example to decompose silicon hydrides into silicon and hydrogen, to convert any polysilanes produced as a by-product of the deposition process within the chamber 10 into silane, or to destroy such polysilanes. Such a device 48 may comprise a plasma abatement device. Again, silicon from silane decomposition may be deposited on the inner surfaces of the gas conduit 44. Alternative treatment devices include a packed bed of inert material, or a bed of CaO.

Other gas treatment devices may be provided as required to remove other specific impurities from the diverted portion of gas.

Before the diverted portion of gas enters the storage vessel 14, the composition of the gas is analysed by a gas analyser 50, which may use an analytical technique such as FTIR to analyse the composition of the purified gas. The result of the analysis is received by the system controller 20, which can issue signals to the valve arrangement 28 to control the flow rates at which the various gases are supplied to the storage vessel 14 from the sources 22, 24, 26 so that the gas stored within the storage vessel 14, which is a gas mixture made up from the purified gas from the gas conduit plus fresh gas from the sources 22, 24, 26, has a composition similar to that originally supplied to the chamber 10 from the storage vessel 14. In this example, hydrogen and silane (and any dopant) will, in general, be continuously supplied to the storage vessel 14 in order to make up for the first portion of gas that is conveyed to the second vacuum pump 34 and abatement device 38, and therefore "lost" from the recirculation loop, with the flow rates of these gases into the storage vessel 14 being adjusted to compensate for any variation in the composition of the purified gas entering the storage vessel 14 from the gas conduit 44.

Figure 2:
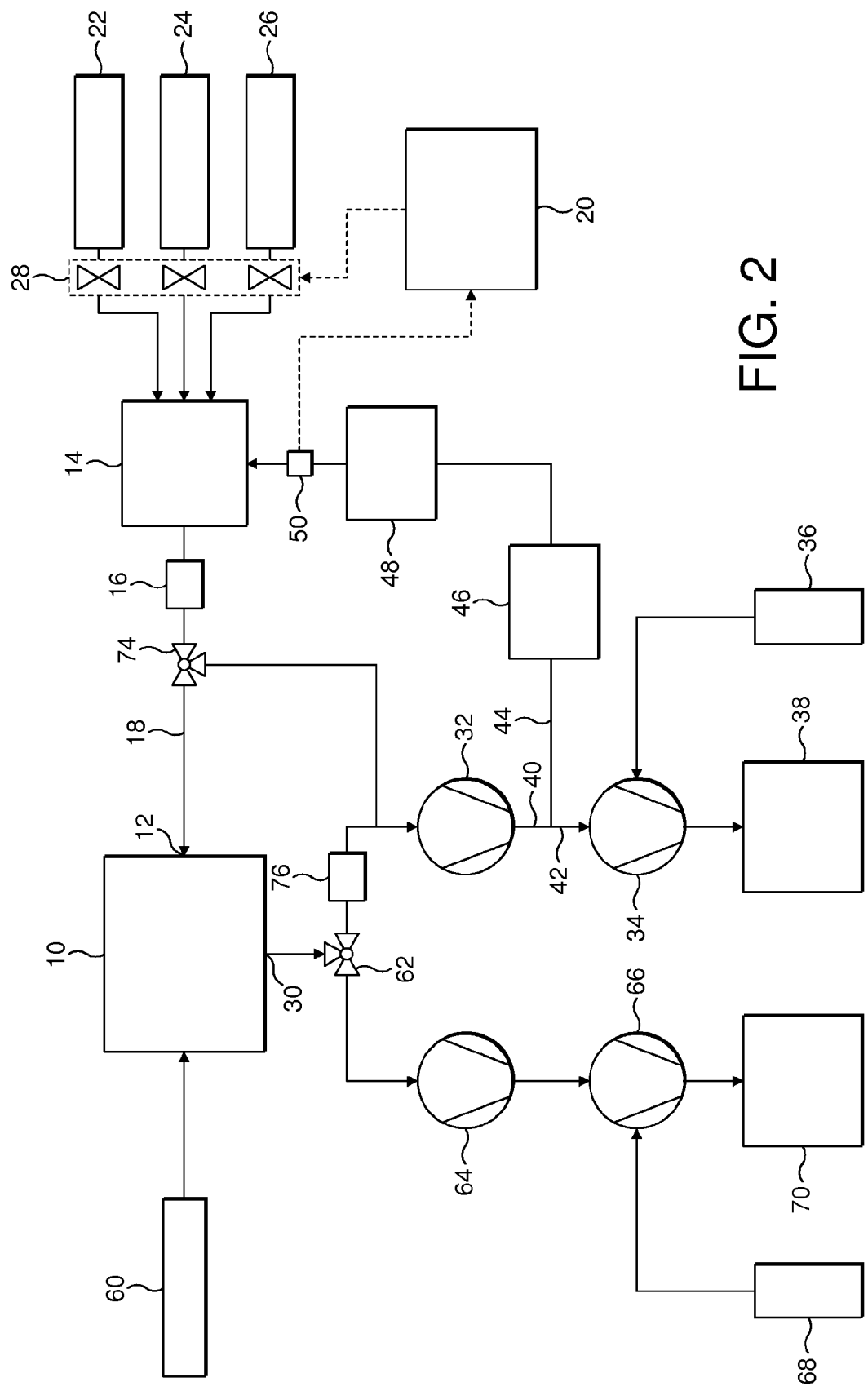
FIG. 2 illustrates schematically another example of an apparatus for recycling hydrogen supplied to a chamber in which a cleaning process is periodically conducted.

With reference now to FIG. 2, periodically a cleaning gas, such as a fluorine ($F_2$), a perfluorinated gas or other fluorine-containing gas, may be supplied to the chamber 10 from cleaning gas source 60 to remove deposits from the internal surfaces of the chamber 10. During the cleaning process, it is desirable to inhibit any ingress of cleaning gas or by-products from the cleaning gas into the recirculating gas. However, in order to improve the degree to which impurities are removed from the recirculating gas, it is also desirable to maintain a continuous flow of gas through a recirculation loop passing through the first vacuum pump 32, gas treatment devices 46, 48 and storage vessel 14.

In view of this, a separate vacuum pumping arrangement is provided for drawing the cleaning gases from the chamber 10 during the cleaning process. As illustrated in FIG. 2, a three way valve 62 is located between the outlet 30 from the chamber 10 and the first vacuum pump 32. The valve 62 is moveable between a first position in which the gas drawn from the chamber 10 passes along a first exhaust path to the first vacuum pump 34, and a second position in which the gas drawn from the chamber 10 passes along a second exhaust path to a third vacuum pump 64. The third vacuum pump 64 may be similar to the first vacuum pump 32, and is backed by a fourth vacuum pump 66. Similar to the second vacuum pump 34, a source 68 of purge gas may be provided for supplying purge gas to the fourth vacuum pump 66. An abatement device for treating the unconsumed cleaning gases and by-products from the cleaning process may be provided downstream from the fourth vacuum pump 66.

Movement of the valve 62 may be controlled by the system controller 20, for example in response to the operation of a valve (not shown) used to control the supply of cleaning gas to the chamber 10 from the cleaning gas source 60.

In order to maintain gas flowing through the recirculation loop during the cleaning process, a three-way valve 74 is provided in the gas conduit 18 for selectively diverting gas supplied from the storage vessel 14 away from the chamber 10 and into a by-pass conduit 72 extending from the gas conduit 18 to the first vacuum pump 32. Again, movement of the valve 74 may be controlled by the system controller 20. The valves 62, 74 may be operated synchronously so that when the supply of the cleaning gas to the chamber 10 has been stopped, the valve 62 is switched so that gases are drawn from the chamber 10 by the first vacuum pump 32, and the valve 74 is switched so that the gas supplied from the storage vessel 14 is conveyed to the chamber 10. As illustrated in FIG. 2, a trap or other gas treatment device 76 may be located between the valve 62 and the first vacuum pump 32 to remove any traces of cleaning gas from the gases drawn from the chamber 10 by the first vacuum pump 32. Alternatively, the valve 74 may be operated before the valve 62 is switched to allow a relatively small amount of the gas supplied from the storage vessel 14 to enter the chamber 10 and subsequently drawn from the chamber 10 by the third vacuum pump 64 in order to "purge" the chamber 10 from cleaning gas. Once this purging has been completed, the valve 62 is switched so that gases are drawn from the chamber 10 by the first vacuum pump 32, and the valve 74 is operated so that the gas supplied from the storage vessel 14 are fully conveyed to the chamber 10.

Figure 3:
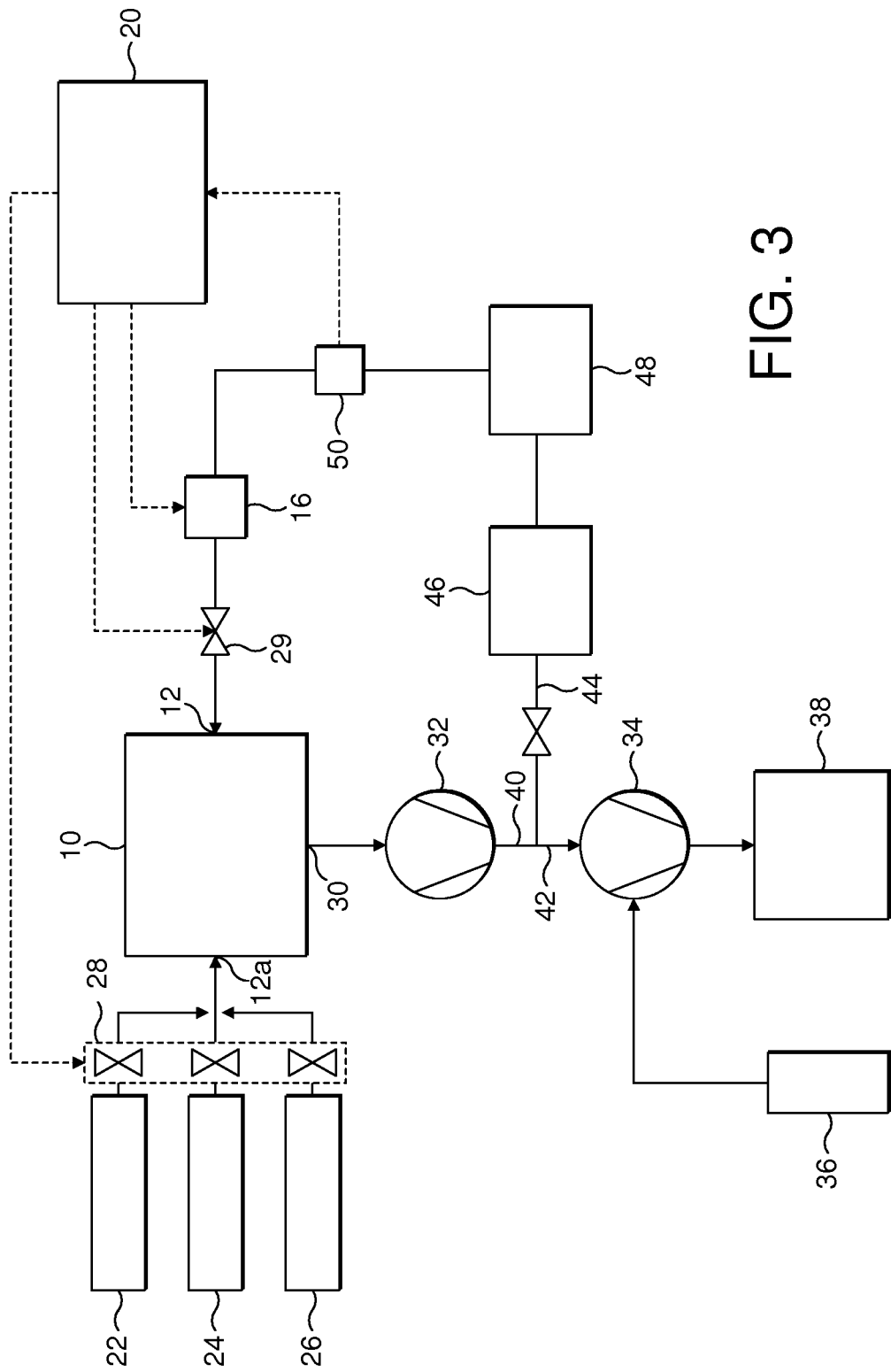
FIG. 3 illustrates schematically a further example of an apparatus for recycling hydrogen supplied to a chamber.

FIG. 3 illustrates a variation of the example illustrated in FIG. 1, in which the storage vessel 14 is omitted. Instead, the gas is supplied from the sources 22, 24, 26 directly into a second inlet 12a of the chamber 10. The system controller 20 issues commands to valve arrangement 28 located between the chamber 10 and these sources 22, 24, 26 to control the respective flow rates of these gases into the chamber 10. As in the example illustrated in FIG. 1, a portion of the gas exhausted from the chamber 10 is returned to the chamber 10 through inlet 12. The system controller 20 responds to the analysis performed by the gas analyser 50 to control the mass flow controller 16 to control the flow rate at which the purified gas is supplied to the inlet 12, and also to control the flow rates at which the gases are supplied from the sources 22, 24, 26 to the chamber 10 so that the gas mixture entering the chamber 10 through the two inlets 12, 12a is of the desired composition. An additional valve 29 may be provided upstream from the inlet 12 for closing the supply of purified gas to the chamber 10, for example in the event the composition of the purified gas is unsuitable for return to the chamber for any reason, or during a chamber cleaning process.

As in the example illustrated in FIG. 2, a three-way valve may be provided between the inlet 12 and the mass flow controller 16 for diverting the purified gas away from the chamber 10 and directly to the first vacuum pump 32 during a chamber cleaning process.

In a first aspect, the present invention provides a method of recycling hydrogen supplied to a chamber, the method comprising the steps of drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, and supplying the purified gas to the chamber.

The invention avoids the need to pump the entire stream of a gas comprising hydrogen to atmospheric pressure for subsequent treatment in an abatement device. A first vacuum pump draws gas from the chamber at a pressure in the range of, for example, 1 to 5 mbar, and exhausts the gas at a sub-atmospheric pressure, for example a pressure in the range from 5 to 100 mbar. The majority of that sub-atmospheric pressure gas, preferably at least 70% and more preferably between 70 and 95%, is diverted away from a second vacuum pump backing the first vacuum pump and is recirculated back to the chamber via one or more gas treatments to produce a purified gas comprising hydrogen. The remaining 5 to 30% of the gas exhausted from the first vacuum pump may be pumped up to atmospheric pressure in a conventional primary vacuum pump and treated in a conventional abatement device, for example a gas burner, before being exhausted to the atmosphere. This "bleed" to the atmosphere of a portion of the gas drawn from the chamber assists in controlling the level of impurities within the recirculated portion of the gas drawn from the chamber. By recycling the majority of the hydrogen supplied to the chamber, significant cost savings may be realised.

The invention finds particular, but not exclusive, use in the recirculation of gas supplied to a chamber in which the hydrogen acts as a carrier gas for at least one other gas. Consequently, the purified gas may be supplied to the chamber in a gas mixture comprising hydrogen and at least one other gas.

In order to control the composition of the gas mixture supplied to the chamber, the purified gas may be stored in a storage vessel prior to supply to the chamber. The composition of the purified gas may be analysed, preferably before storage in the storage vessel, and, depending on the composition of the purified gas, at least one of hydrogen and said at least one gas may be added to the gas stored in the storage vessel so that the composition of the stored gas is similar to that of the gas initially supplied to the chamber. Therefore, in a second aspect the present invention provides a method of recycling hydrogen ($H_2$) supplied to a chamber in a gas stream comprising hydrogen and at least one other gas, the method comprising the steps of drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, storing the purified gas in a storage vessel, analysing the composition of the purified gas, depending on the composition of the purified gas adding at least one of hydrogen and said at least one other gas to the gas stored in the storage vessel, and supplying gas from the storage vessel to the chamber.

The diverted portion of the sub-atmospheric pressure gas may treated to substantially remove said at least one other gas therefrom. In this case, a fixed amount of this gas may be continually fed into the storage vessel. Alternatively, in order to reduce the amount of this gas which is supplied to the storage vessel the diverted portion of the sub-atmospheric pressure gas may be treated so that the purified gas comprises hydrogen and said at least one other gas.

An example of this other gas is a silicon hydride such as silane, which may be thermally decomposed to form silicon and hydrogen. Alternatively, polysilanes within the diverted portion of the sub-atmospheric pressure gas may be converted to silane, for example in a plasma abatement device, which is conveyed to the storage vessel along within the sub-atmospheric pressure hydrogen gas. In this case, a gas analyser using an analytical technique such as FTIR may be used to analyse the composition of the purified gas, with the flow rates at which hydrogen and silane are respectively supplied to the storage vessel being controlled in dependence on the analysed composition.

Another example of this other gas is a dopant gas such as $PH_3$ or $B_2H_6$, which may be removed from the diverted portion of the sub-atmospheric pressure gas using a gas purifier. Fresh dopant may then be supplied to the storage vessel for subsequent supply to the chamber with the silicon hydride and hydrogen carrier gas.

A gas stream comprising a silicon hydride within a hydrogen carrier gas finds particular, but not exclusive, use in the chemical vapour deposition of silicon on the surface of a substrate, and so in a third aspect the present invention provides a method of performing deposition of silicon on a substrate located in a chamber, the method comprising the steps of supplying a gas comprising hydrogen and a silicon hydride to the chamber from a storage vessel, drawing gas comprising at least hydrogen from the chamber using a first vacuum pump that exhausts gas therefrom at a sub-atmospheric pressure, diverting away from a second vacuum pump backing the first vacuum pump a portion of the sub-atmospheric pressure gas exhausted from the first vacuum pump, treating the diverted portion of the sub-atmospheric pressure gas to produce a purified gas comprising hydrogen, storing the purified gas in the storage vessel, analysing the composition of the purified gas, depending on the composition of the purified gas, adding at least one of hydrogen and said silicon hydride to the gas stored in the storage vessel.

Examples of silicon hydrides include silane, disilane, dichlorosilane and trichlorosilane.

A cleaning gas, for example a fluorinated gas such as $F_2$ or a perfluorinated gas, may be periodically supplied to the chamber. In order to avoid contamination of the recirculating gases, during the supply of cleaning gas to the chamber the cleaning gas may be drawn from the chamber using a third vacuum pump, with the gas supplied from the storage vessel bypassing the chamber and being supplied directly to the first vacuum pump. This continuous recirculation of gas within a sub-atmospheric pressure gas loop extending between the storage vessel/, first vacuum pump and gas treatment devices can assist in removing trace impurities from the gas stream.

Upon completion of the chamber cleaning, the supply of the cleaning gas to the chamber is stopped. In order to prevent cleaning gas entering the recirculation loop, gas may be supplied from the storage vessel to the chamber before the drawing of gas from the chamber is switched from the third vacuum pump to the first vacuum pump. This can "flush" any remaining cleaning gas from the chamber before the recirculation through the chamber is fully re-established. Additionally, or alternatively, gas drawn from the chamber by the first vacuum pump may be conveyed through a trap prior to entering the first vacuum pump to remove cleaning gas therefrom.

Features described above in relation to method aspects of the invention are equally applicable to apparatus aspects, and vice versa.

In a fourth aspect, the present invention provides apparatus for recycling hydrogen ($H_2$) supplied to a chamber, the apparatus comprising a first vacuum pump for drawing gas comprising at least hydrogen from the chamber and exhausting gas at a sub-atmospheric pressure therefrom, a second vacuum pump for receiving sub-atmospheric pressure gas from the first vacuum pump, means for diverting away from the second vacuum pump a portion of the sub-atmospheric pressure gas exhausted from the first vacuum pump, means for treating the diverted portion of the sub-atmospheric pressure gas to produce a purified gas comprising hydrogen, and gas supply means for supplying the purified gas to the chamber.

In a fifth aspect, the present invention provides apparatus for recycling hydrogen ($H_2$) supplied to a chamber in a gas stream comprising hydrogen and at least one other gas, the apparatus comprising a first vacuum pump for drawing gas comprising at least hydrogen from the chamber and exhausting gas at a sub-atmospheric pressure therefrom, a second vacuum pump for receiving sub-atmospheric pressure gas from the first vacuum pump, means for diverting away from the second vacuum pump a portion of the sub-atmospheric pressure gas exhausted from the first vacuum pump, means for treating the diverted portion of the sub-atmospheric pressure gas to produce a purified gas comprising hydrogen, a storage vessel for storing the purified gas in a storage vessel, a gas analyser for analysing the composition of the purified gas, means for adding at least one of hydrogen and said at least one other gas to the gas stored in the storage vessel depending on the composition of the purified gas, and means for supplying gas from the storage vessel to the chamber.

While the foregoing description and drawings represent the preferred embodiments of the present invention, it will be apparent to those skilled in the art that various changes and modifications may be made therein without departing from the true spirit and scope of the present invention.

I claim:

1. A method of recycling hydrogen ($H_2$) supplied to a chamber, the method comprising the steps of:
   drawing gas comprising at least hydrogen from the chamber using a first vacuum pump that exhausts gas therefrom at a sub-atmospheric pressure;
   diverting away from a second vacuum pump backing the first vacuum pump a portion of the sub-atmospheric pressure gas exhausted from the first vacuum pump;
   treating the diverted portion of the sub-atmospheric pressure gas to produce a purified gas comprising hydrogen; and
   supplying the purified gas to the chamber.

2. The method according to claim 1 wherein the step of supplying the purified gas to the chamber comprises supplying the purified gas in a gas mixture comprising hydrogen and at least one other gas.

3. The method according to claim 2 comprising the step of storing the purified gas in a storage vessel prior to supplying the purified gas to the chamber, and wherein the method comprises the steps of analysing the composition of the purified gas, and, depending on the composition of the purified gas, adding said at least one gas to the gas stored in the storage vessel.

4. The method according to claim 2 comprising the step of treating the diverted portion of the sub-atmospheric pressure gas so that the purified gas comprises hydrogen and said at least one other gas.

5. The method according to claim 2 comprising the step of treating the diverted portion of the sub-atmospheric pressure gas to remove said at least one other gas therefrom.

6. The method according to claim 2 wherein said at least one other gas comprises a silicon hydride.

7. The method according to claim 1 comprising periodically supplying a cleaning gas to the chamber, and, during the supply of cleaning gas to the chamber, drawing the cleaning gas from the chamber using a third vacuum pump.

8. The method according to claim 7 wherein, during the step of supplying of cleaning gas to the chamber, supplying purified gas directly to the first vacuum pump.

9. The method according to claim 8 wherein, upon completion of the chamber cleaning, the stopping the supply of said cleaning gas to the chamber and supplying purified gas to the chamber before the drawing of gas from the chamber is switched from the third vacuum pump to the first vacuum pump.

10. The method according to claim 7 comprising the step of treating gas drawn from the chamber by the first vacuum pump, prior to entering the first vacuum pump, to remove cleaning gas therefrom.

11. The method according to claim 7 wherein the cleaning gas comprises a fluorine-containing gas.

12. The method according to claim 1 comprising the step of treating the diverted portion of sub-atmospheric gas and supplying the treated diverted portion of gas to the chamber at a sub-atmospheric pressure.

13. The method according to claim 1 comprising the step of treating the diverted portion of sub-atmospheric gas and supplying the diverted portion of gas to the chamber at a pressure in the range from 5 to 100 mbar.

14. The method according to claim 1 comprising the step of diverting away from the second vacuum pump at least 70% of the sub-atmospheric pressure gas exhausted from the first vacuum pump.

15. The method according to claim 1 comprising the step of diverting away from the second vacuum pump between 70 and 95% of the sub-atmospheric pressure gas exhausted from the first vacuum pump.

16. The method according to claim 1 wherein the flow rate of the diverted portion of sub-atmospheric pressure gas is at least 800 slm.

17. Apparatus for recycling hydrogen ($H_2$) supplied to a chamber, the apparatus comprising:
   a first vacuum pump for drawing gas comprising at least hydrogen from the chamber and exhausting gas at a sub-atmospheric pressure therefrom;
   a second vacuum pump for receiving sub-atmospheric pressure gas from the first vacuum pump;
   means for diverting away from the second vacuum pump a portion of the sub-atmospheric pressure gas exhausted from the first vacuum pump;
   means for treating the diverted portion of the sub-atmospheric pressure gas to produce a purified gas comprising hydrogen; and
   gas supply means for supplying the purified gas to the chamber.

18. Apparatus according to claim 17 wherein the gas supply means is arranged to supply the purified gas to the chamber in a gas mixture comprising hydrogen and at least one other gas.

19. Apparatus according to claim 18 wherein the gas supply means comprises a storage vessel for storing the purified gas prior to supply to the chamber, a gas analyser for analysing the composition of the purified gas, and means for adding said at least one gas to the gas stored in the storage vessel depending on the composition of the purified gas.

20. Apparatus according to claim 18 wherein the gas treatment means is arranged to treat the diverted portion of the sub-atmospheric pressure gas so that the purified gas comprises hydrogen and said at least one other gas.

21. Apparatus according to claim 18 wherein the gas treatment means is arranged to treat the diverted portion of the sub-atmospheric pressure gas to remove said at least one other gas therefrom.

22. Apparatus according to claim 18 wherein said at least one other gas comprises a silicon hydride.

23. Apparatus according to claim 18 comprising means located upstream from the first vacuum pump for treating gas drawn from the chamber to remove a fluorine-containing gas therefrom.

24. Apparatus according to claim 18 comprising means for diverting the gas supplied from the gas supply means directly to the first vacuum pump.

25. Apparatus according to claim 18 wherein the gas treatment means is arranged to treat the diverted portion of sub-atmospheric gas at a pressure in the range from 5 to 100 mbar.

26. Apparatus according to claim 18 wherein the diverting means is arranged to divert at least 70% of the sub-atmospheric pressure gas exhausted from the first vacuum pump away from the second vacuum pump.

27. Apparatus according to claim 18 wherein the diverting means is arranged to divert between 70 and 95% of the sub-atmospheric pressure gas exhausted from the first vacuum pump away from the second vacuum pump.

* * * * *

UNITED STATES PATENT AND TRADEMARK OFFICE
CERTIFICATE OF CORRECTION

PATENT NO.        : 8,454,728 B2                                            Page 1 of 1
APPLICATION NO.   : 12/440985
DATED             : June 4, 2013
INVENTOR(S)       : Robert Bruce Grant It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 973 days.

Signed and Sealed this
Eighth Day of September, 2015

Michelle K. Lee
*Director of the United States Patent and Trademark Office*